(12) United States Patent
Tagami et al.

(10) Patent No.: US 8,377,823 B2
(45) Date of Patent: Feb. 19, 2013

(54) SEMICONDUCTOR DEVICE INCLUDING POROUS LAYER COVERED BY PORESEAL LAYER

(75) Inventors: Masayoshi Tagami, Kawasaki (JP); Fuminori Ito, Kawasaki (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 10 days.

(21) Appl. No.: 12/929,699

(22) Filed: Feb. 9, 2011

(65) Prior Publication Data

US 2011/0198754 A1    Aug. 18, 2011

Related U.S. Application Data

(60) Provisional application No. 61/305,454, filed on Feb. 17, 2010.

(51) Int. Cl.
*H01L 21/28* (2006.01)
(52) U.S. Cl. ............................... 438/653; 257/E21.158
(58) Field of Classification Search ........................ None
See application file for complete search history.

(56) References Cited

U.S. PATENT DOCUMENTS

| | | |
|---|---|---|
| 6,919,636 B1 | 7/2005 | Ryan |
| 7,179,758 B2 | 2/2007 | Chakrapani et al. |
| 7,541,200 B1 | 6/2009 | van Schravendijk et al. |
| 7,541,679 B2 | 6/2009 | Cooney, III et al. |
| 2006/0024980 A1* | 2/2006 | Tsuchiya et al. .............. 438/789 |
| 2006/0160374 A1* | 7/2006 | Ho et al. ...................... 438/784 |
| 2007/0013069 A1 | 1/2007 | Tada et al. |
| 2010/0151675 A1 | 6/2010 | Tada et al. |

FOREIGN PATENT DOCUMENTS

WO    WO 2004/107434 A1    9/2004

* cited by examiner

*Primary Examiner* — Seahvosh Nikmanesh
(74) *Attorney, Agent, or Firm* — McGinn IP Law Group, PLLC (57) ABSTRACT

A method of forming a semiconductor device includes forming a trench on a porous insulating film, placing a chemical material including a structure comprising —Si—O— including vinyl group on a surface of the porous insulating film or in the porous insulating film, and performing polymerization of the chemical material to provide a dielectric film having a density higher than that of porous insulating film on the surface of the trench. The structure may be a structure defined by a formula 1.

15 Claims, 8 Drawing Sheets

Figure 1

Figure 2A
RIE (+cap open) → wet (dHF) → degas

Figure 2B
Poreseal film deposition (<3nm)

Figure 2C
2nd Cap open (DF) and wet (dHF or organic)
Poreseal film disappearance
Line width shrink Figure 2D
Metallization and CMP Formula 1

Figure 4

Figure 5A
RIE → wet (dHF) → degas

Figure 5B
Gas flow or light plasma

Figure 5C
Thermal, UV and plasma cure

Figure 5D
Metallization and CMP

RIE (+cap open) → wet (dHF) → surface treatment (He, He/H2)

Figure 7B

Gas flow or light plasma

Figure 7C

Thermal, UV and plasma cure

Figure 7D

Metallization and CMP

SEMICONDUCTOR DEVICE INCLUDING POROUS LAYER COVERED BY PORESEAL LAYER

The present application is a Nonprovisional application of Provisional U.S. Patent Application No. 61/305,454, filed on Feb. 17, 2010, incorporated herein by reference.

BACKGROUND OF THE INVENTION

1. Field of the Invention

The present invention relates to a semiconductor device, in particular, to a semiconductor device including a porous layer covered by a poreseal layer.

2. Description of Related Art

Figure 1:
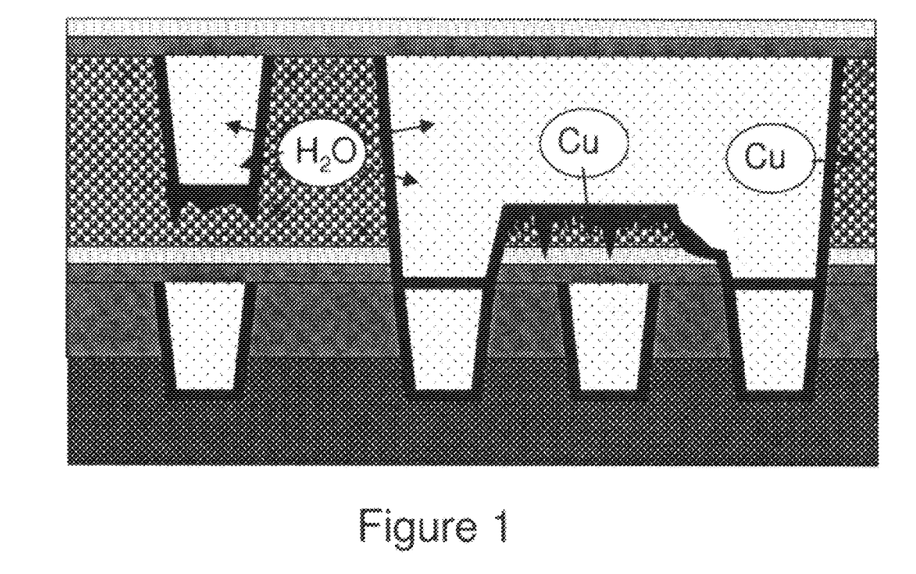
FIG. 1 illustrates a cross-sectional view of a semiconductor device for showing a problem according to a related art.
Figure 2A:
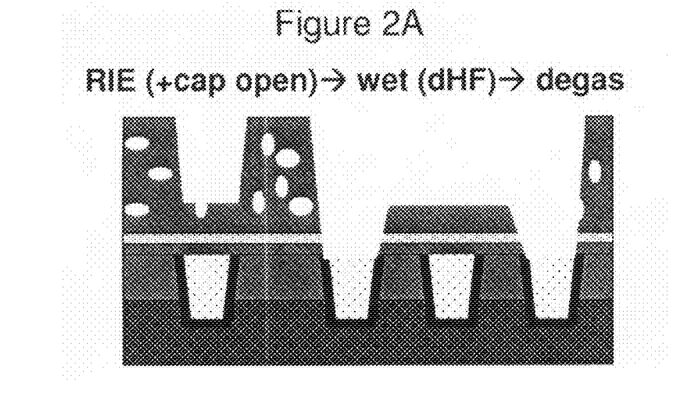
FIGS. 2A to 2D illustrate cross-sectional views showing steps for forming a semiconductor device according to a related art.
Figure 2B:
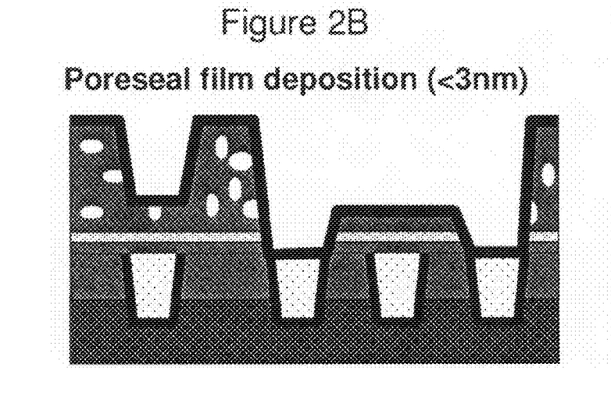
Figure 2C:
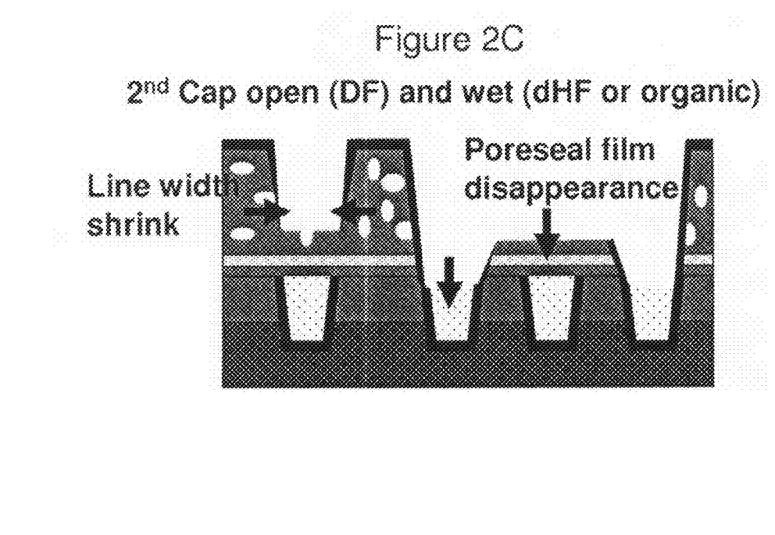
Figure 2D:
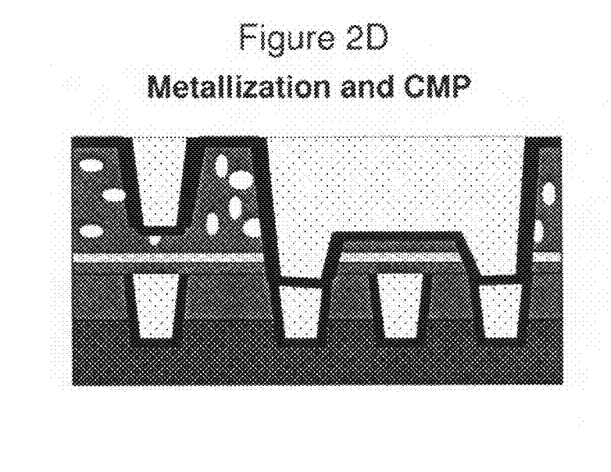

Porous low-k material has a continuous open pore connectivity more than 0.7 nm. This causes the moisture and Copper (Cu) penetration into the porous low-k material. As results, the Cu diffusion causes the early TDDB failure and moisture outgas causes oxidization of a barrier metal to degrade the via open yields and Electro-Migration (EM) life time, as shown in FIG. 1. Therefore, a poreseal process is suggested by, for example, JP WO2004/107434, U.S. Pat. No. 7,541,679, U.S. Pat. No. 7,179,758, and U.S. Pat. No. 6,919,636. Otherwise, low-k repair method is suggested to improve just surface damage as the —(CH3)3 bond from chemistry adsorb —Si—O bonds, for example, by U.S. Pat. No. 7,541,200.

SUMMARY

The inventors have realized the problems related to the above related arts.

With the poreseal process, a poreseal film is deposited on Cu at the bottom of via as well as on porous low-k material. As a result, an additional etch back process is demanded to open the poreseal film at the via bottom, as shown in FIGS. 2A-2D.

When the etch back process is applied to open the poreseal at the via bottom, the poreseal film at the trench bottom is also etched back and thinned down. The poreseal film thinned down might not work as poreseal. CD control difficulty is another problem for the poreseal process. It is required for the poreseal film to deposit on the porous low-k film after M2 etching. Therefore, its line width is narrowed by the poreseal film and this causes the increase of line resistance.

Figure 3A:
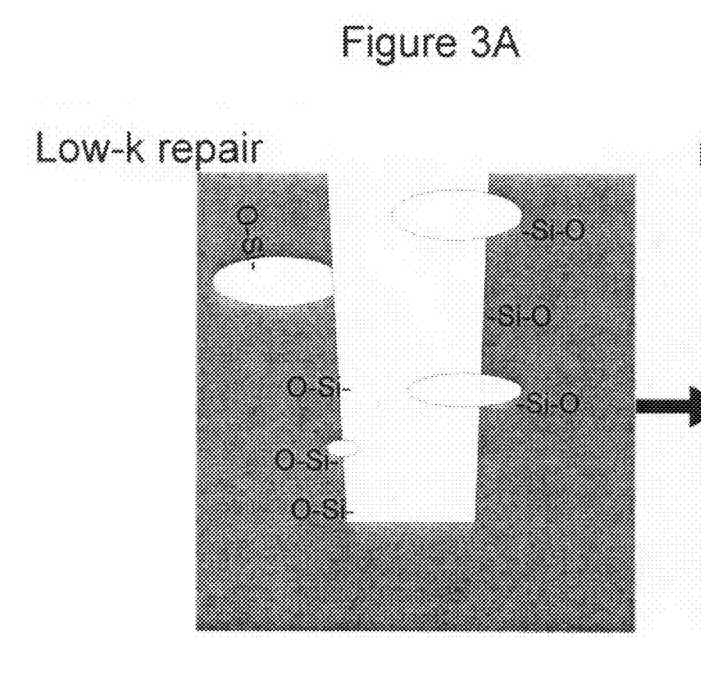
FIGS. 3A to 3B illustrate cross-sectional views for showing a problem according to a related art.
Figure 3B:
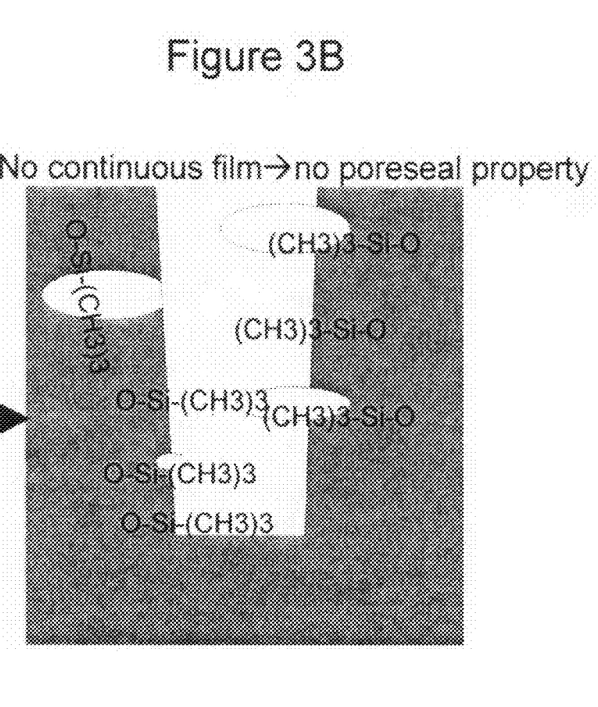

The low-k repair can improve the porous low-k damage, but it is difficult to obtain the continuous poreseal film, as shown in FIGS. 3A-3B. As results, continuous pores in porous film are still exposed at the surface of trench side and bottom.

As to a method of forming a semiconductor device according to an exemplary aspect of the present invention, a gas chemistry including a structure comprising —Si—O— including vinyl group, for example, a structure defined by a formula 1, is activated by thermal or light plasma and adsorbs with Si—O— bond. Then, a polymerization is applied by thermal, EB, plasma or UV cure system, to form a continuous poreseal film just on porous low-k film.

Etchback process after poreseal deposition doesn't need. The poreseal film at the trench bottom can thus be retained enough and poreseal effects works well. The poreseal isn't deposited on other materials such as Cu, but just deposited on surface or inside porous low-k. Therefore, CD loss of trench width can be reduced.

BRIEF DESCRIPTION OF THE DRAWINGS

The above and other exemplary aspects, advantages and features of the present invention will be more apparent from the following description of certain exemplary embodiments taken in conjunction with the accompanying drawings, in which.

DETAILED DESCRIPTION OF THE EXEMPLARY EMBODIMENTS

Figure 5A:
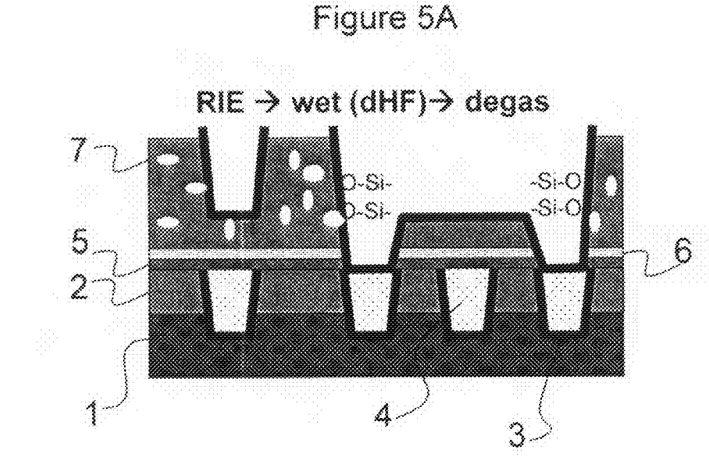
FIGS. 5A to 5D illustrate cross-sectional views showing steps for forming a semiconductor device of a first exemplary embodiment according to the present invention.

FIGS. 5A to 5D illustrate cross-sectional views showing steps for forming a semiconductor device of a first exemplary embodiment according to the present invention;

As shown in FIG. 5A, a dielectric layer 2 of a 1st line level is formed on a dielectric layer 1. A plurality of trenches is formed on the dielectric layer 2. A barrier metal 3 is formed on the surface of the trenches and a copper 4 is buried in the trenches. A cap dielectric layer 5 is formed on the surface of the dielectric layer 2 and on the surface of the copper 4. An adhesion layer 6 is formed on the cap dielectric layer 5, and a dielectric layer 7 of a 2nd line level is formed on the adhesion layer 6. The dielectric layer 7 is formed with a porous SiOCH film. The porous low-k film 7 is etched by gas chemistry and wet etching is performed for M2 dual damascene formation.

Figure 5B:
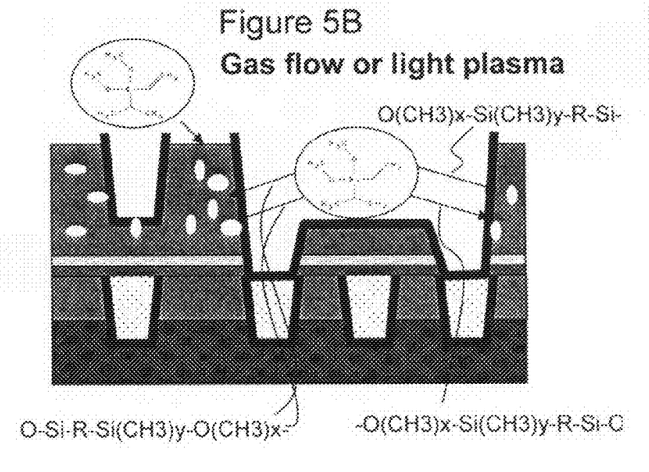
Figure 5C:
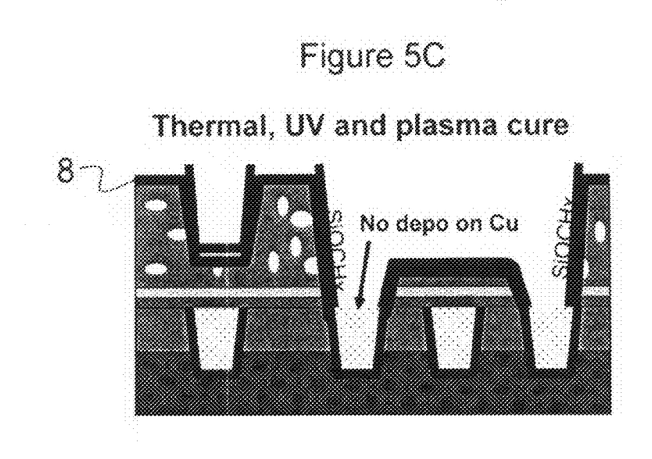
Figures 6A, 6B, 6C:
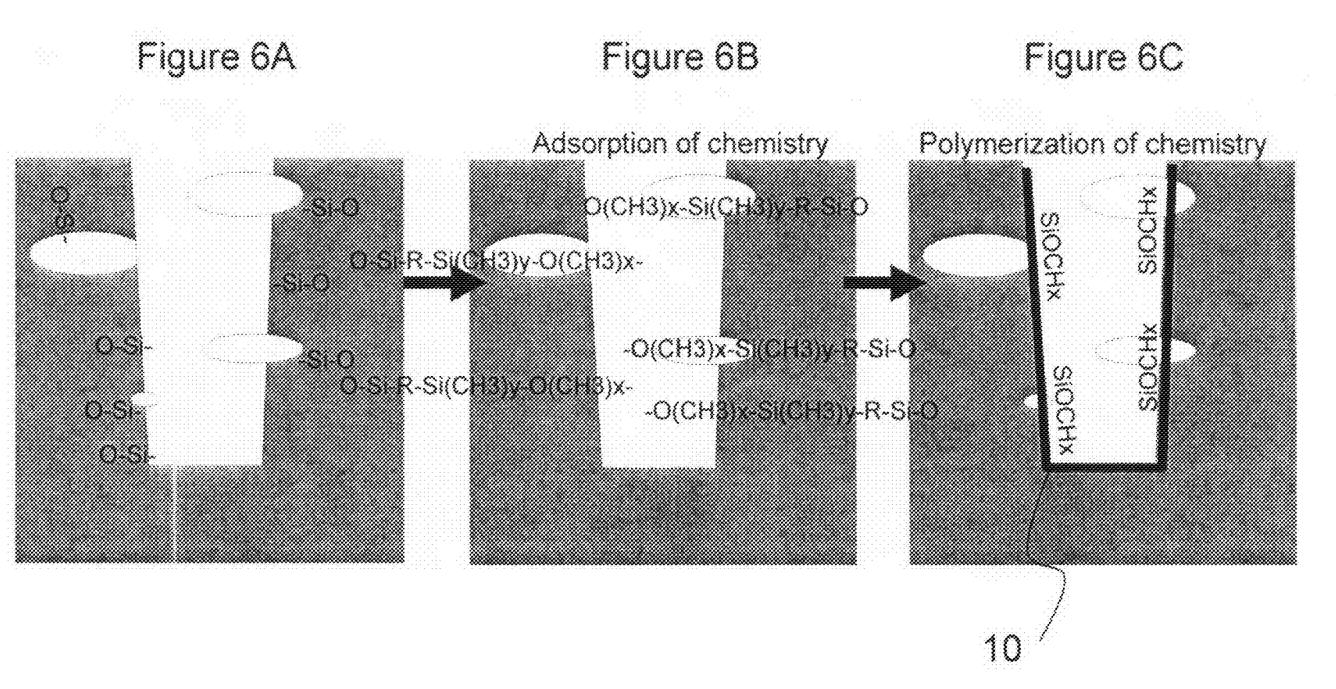
FIGS. 6A to 6C illustrate cross-sectional views showing a mechanism of the present invention.

Then, a gas flow or light plasma process is performed as shown in FIG. 5B. FIG. 5 and FIGS. 6A to 6C show gas chemistry in the vacuum chamber. FIGS. 6A to 6C show a chemical reaction mechanism at a trench side and bottom at the left side of FIG. 5A, for example. The surface of porous SiOCH film 7 has C depleted damage layer. This means that O—Si— bond exists around the surface of porous SiOCH film 7. When the O—Si— bond exists around the surface of the porous low-k film 7, the introduced gas is easily reacted with O—Si— bond by thermal or light plasma. Then after stopping gas flow, UV cure, plasma treatment or thermal cure is applied to polymerize the gases on porous SiOCH surface, selectively, as shown in FIGS. 5C, 6B and 6C. These treatments provide a polymerized thin film 10, which is composed of SiOCH, as shown in FIG. 6C. It has maximum poresize <0.5 nm, k<=4, C/Si>2, E=20 GPa and Cu barrier property. Because the gas chemistry doesn't react with Cu at the bottom of the via surface, it is not needed to apply etch back to open the poreseal. The poreseal film 7 at the bottom of the trench isn't also etched back. Sufficient thickness of the poreseal film 7 is remaining at the trench bottom. This poreseal structure has highly tolerance against Cu diffusion and degas from the porous low-k material. The Cu interconnect characteristics such as TDDB, EM and via open yield are improved.

Thereafter, a barrier metal 8 is formed on the surface of the poreseal film 7 as shown in FIG. 5C. Chemical vapor deposition (CVD) or atomic layer deposition (ALD) barrier metal as well as physical vapor deposition (PVD) such as Ta, TaN, Ru and Co can be used for barrier metal deposition method, because poreseal film can suppress gas diffusion into porous SiOCH film. Then, a metallization and CMP are performed as shown in FIG. 5D, to form a copper wiring 9.

Figure 5D:
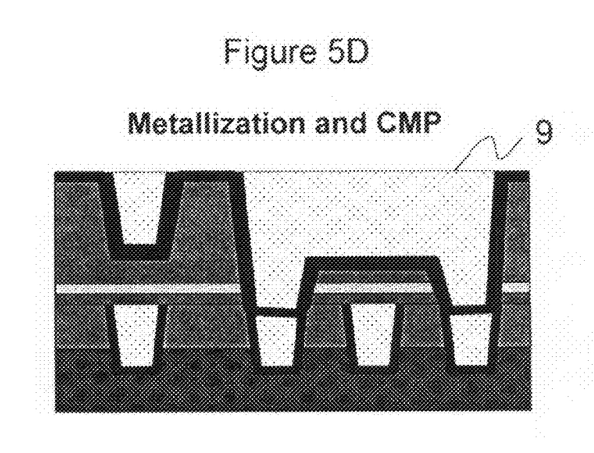
Figure 7A:
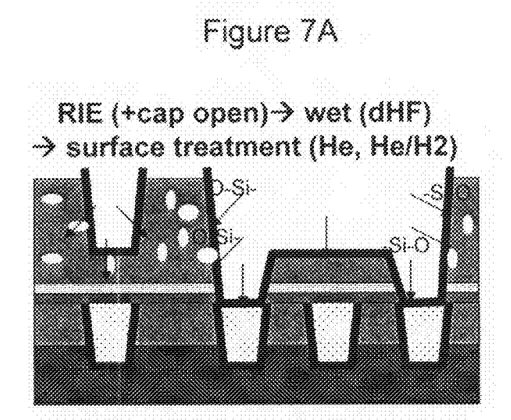
FIGS. 7A to 7D illustrate cross-sectional views showing steps for forming a semiconductor device of a second exemplary embodiment according to the present invention.
Figure 7B:
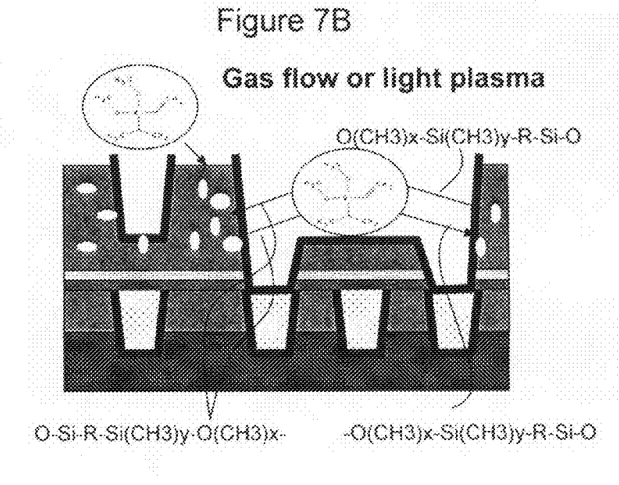
Figure 7C:
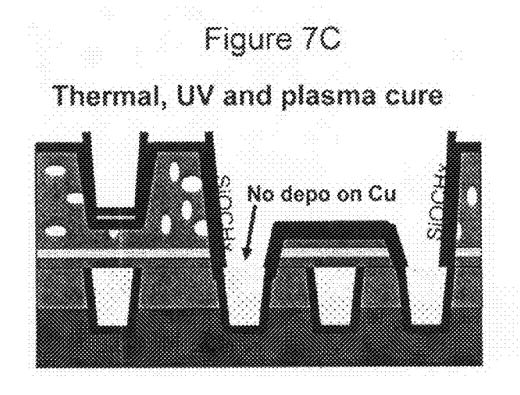
Figure 7D:
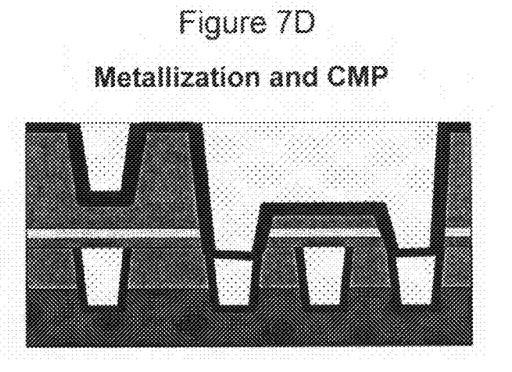

FIGS. 7A to 7D illustrate cross-sectional views showing steps for forming a semiconductor device of a second exemplary embodiment according to the present invention; and The process described in FIGS. 7B to 7D is same as the process described in FIGS. 5B to 5D. Therefore, the explanation for the FIGS. 7B to 7D is omitted.

As shown in FIG. 7A, RIE etching, wet etching and surface treatment such as hydrogen plasma or a hydrogen including a helium plasma are performed to activate surface of porous film before poreseal formation.

Figure 4:
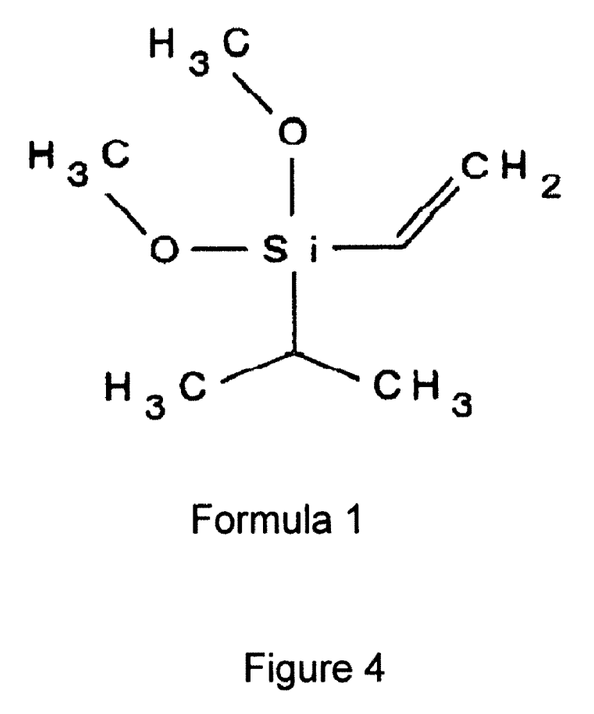
FIG. 4 illustrates a chemical formula 1 which is used for an exemplary embodiment of the present invention.

In sum, according to the exemplary embodiments of the present invention, the poreseal film 10 is formed on the surface or inside of porous low-k material (porous SiOCH) by polymerization after gas chemical adsorption in —Si—O bond. As results, the poreseal film 10 can be formed just on the surface of porous-low-k material and not be deposited on Cu and high dense dielectric film. This can eliminate etch back process after the poresealing process of the relater art. Moreover, the poreseal film 10 on trench bottom can easily retain. This can improve seal properties for interconnects. This gas adsorption and polymerized poreseal film should be better to be deposited with using the precursor as shown Formula 1 in FIG. 4.

Figure 8:
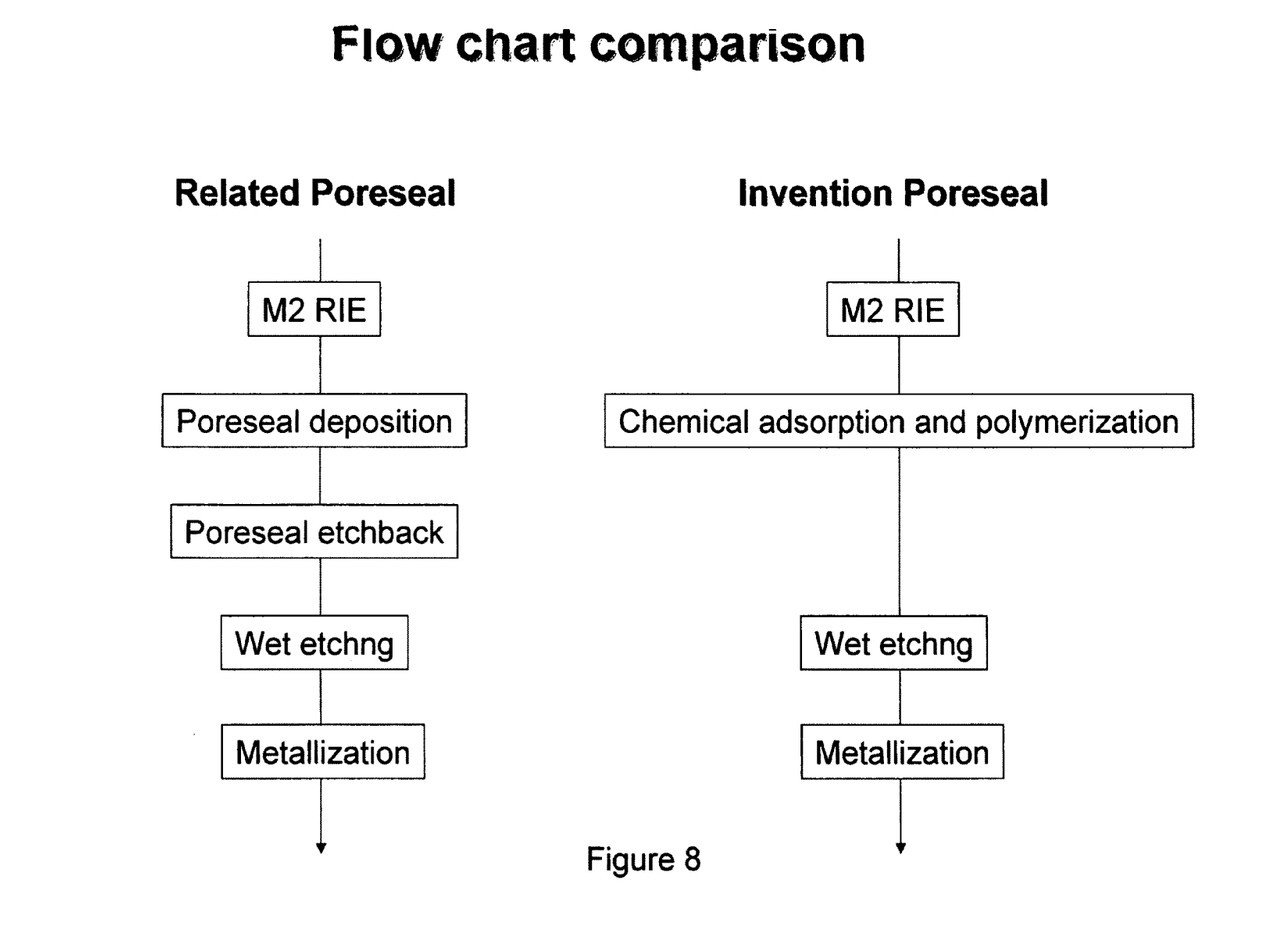
FIG. 8 illustrates a flow chart comparison of the poreseal process of the related art and the present invention.

The process method can obtain the continuous thin poreseal film 10 just on the porous low-k film. The process is comprised that gas chemistry as shown in Formula 1 is activated by light plasma and adsorbs with Si—O— bond, which is exposed after dry and wet etching, in porous SiOCH films. Then, polymerization is applied by thermal, UV cure or plasma treatment system to obtain the continuous poreseal film 10 just on porous low-k film. FIG. 8 illustrates a flow chart comparison. As apparent from the figure, the process of the present invention includes the chemical adsorption and polymerization. On the contrary, the related process includes the poreseal deposition and the poreseal etchback. The present invention is thus able to remove the etchback process.

It should be noted that the present invention is not limited only to the above described exemplary embodiments, and of course, various changes can be made within the scope not deviating from the gist of the present invention.

Further, it is noted that Applicant's intent is to encompass equivalents of all claim elements, even if amended later during prosecution.

What is claimed is:

1. A method of forming a semiconductor device, said method comprising:
   forming a trench on a porous insulating film;
   after said forming the trench, placing a chemical material including a structure comprising —Si—O— including vinyl group on a surface of the porous insulating film or in the porous insulating film; and
   performing polymerization of the chemical material to provide a dielectric film having a density higher than that of the porous insulating film on the surface of the trench,
   wherein the structure comprises a structure defined by Formula 1.

Formula 1

2. The method as claimed in claim 1, wherein the placing the chemical material comprises placing the chemical material in a plasma of a low energy that activates a portion of a modified base of the chemical material.

3. The method as claimed in claim 1, wherein a molecule size of the chemical material is less than a pore-size of the porous insulating film.

4. The method as claimed in claim 1, wherein the polymerization comprises a plasma exposure including a heat anneal and an ultraviolet exposure.

5. The method as claimed in claim 1, wherein the forming the trench comprises exposing a wiring space portion between copper wirings.

6. The method as claimed in claim 1, wherein the dielectric film is not formed on a copper exposed at a bottom surface of a via hole so that an etch-back is not provided after the dielectric film is formed.

7. The method as claimed in claim 1, further comprising, after the trench is formed, performing a surface treatment to form an active —Si—O bond on the surface of the porous insulating film, and to deactivate a surface of a copper.

8. The method as claimed in claim 7, wherein the surface treatment comprises a hydrogen plasma or a hydrogen including a helium plasma.

9. The method as claimed in claim 1, further comprising:
   forming a metal layer by using a chemical vapor deposition method or an atomic layer deposition method on the dielectric film; and
   forming a copper layer on the metal layer.

10. The method as claimed in claim 1, wherein, in said placing a chemical material, the structure defined by Formula 1 is activated by a light plasma and is adsorbed with a Si—O— bond in the porous insulating film.

11. The method as claimed in claim 1, wherein said placing the chemical material comprises a chemical adsorption before said performing polymerization.

12. A method of forming a semiconductor device, said method comprising:
   forming a trench on a porous insulating film;
   after said forming the trench, placing a chemical material including a structure comprising —Si—O— including vinyl group on a surface of the porous insulating film or in the porous insulating film; and
   performing polymerization of the chemical material to provide a dielectric film having a density higher than that of the porous insulating film on the surface of the trench,
   wherein the placing the chemical material comprises placing the chemical material in a plasma of a low energy that activates a portion of a modified base of the chemical material.

13. A method of forming a semiconductor device, said method comprising:
   forming a trench on a porous insulating film;
   after said forming the trench, placing a chemical material including a structure comprising —Si—O— including vinyl group on a surface of the porous insulating film or in the porous insulating film; and performing polymerization of the chemical material to provide a dielectric film having a density higher than that of the porous insulating film on the surface of the trench, wherein a molecule size of the chemical material is less than a pore-size of the porous insulating film.

14. A method of forming a semiconductor device, said method comprising:

forming a trench on a porous insulating film;

after said forming the trench, placing a chemical material including a structure comprising —Si—O— including vinyl group on a surface of the porous insulating film or in the porous insulating film; and performing polymerization of the chemical material to provide a dielectric film having a density higher than that of the porous insulating film on the surface of the trench, wherein the dielectric film is not formed on a copper exposed at a bottom surface of a via hole so that an etch-back is not provided after the dielectric film is formed.

15. A method of forming a semiconductor device, said method comprising:

forming a trench on a porous insulating film;

after said forming the trench, placing a chemical material including a structure comprising —Si—O— including vinyl group on a surface of the porous insulating film or in the porous insulating film;

performing polymerization of the chemical material to provide a dielectric film having a density higher than that of the porous insulating film on the surface of the trench; and after said forming the trench, performing a surface treatment to form an active —Si—O bond on the surface of the porous insulating film, and to deactivate a surface of a copper.

* * * * *